United States Patent
Roy et al.

(10) Patent No.: US 9,640,256 B1
(45) Date of Patent: May 2, 2017

(54) NONVOLATILE STATIC RANDOM ACCESS MEMORY (NVSRAM) SYSTEM HAVING A STATIC RANDOM ACCESS MEMORY (SRAM) ARRAY AND A RESISTIVE MEMORY ARRAY

(71) Applicant: FREESCALE SEMICONDUCTOR, INC., Austin, TX (US)

(72) Inventors: Anirban Roy, Austin, TX (US); Jon S. Choy, Austin, TX (US); Michael A. Sadd, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/165,041

(22) Filed: May 26, 2016

(51) Int. Cl.
| | |
|---|---|
| *G11C 8/00* | (2006.01) |
| *G11C 14/00* | (2006.01) |
| *H01L 27/11* | (2006.01) |
| *H01L 27/24* | (2006.01) |
| *G11C 11/419* | (2006.01) |
| *G11C 11/16* | (2006.01) |

(52) U.S. Cl.
CPC ...... *G11C 14/0081* (2013.01); *G11C 11/1673* (2013.01); *G11C 11/419* (2013.01); *H01L 27/1112* (2013.01); *H01L 27/2436* (2013.01)

(58) Field of Classification Search
CPC .......... G11C 7/02; G11C 7/18; G11C 11/4091
USPC ........................ 365/230.03, 206, 207, 189.05
See application file for complete search history.

(56) References Cited

U.S. PATENT DOCUMENTS

| | | | |
|---|---|---|---|
| 6,457,108 B1 | 9/2002 | Hsu et al. | |
| 6,522,581 B2 * | 2/2003 | Takata | G11C 11/005 |
| | | | 365/181 |
| 6,788,605 B2 * | 9/2004 | Sharma | G11C 11/005 |
| | | | 365/149 |
| 7,791,941 B2 | 9/2010 | Hanafi | |
| 8,295,079 B2 | 10/2012 | Yamamoto et al. | |
| 8,422,295 B1 | 4/2013 | Lin et al. | |
| 2016/0019964 A1 | 1/2016 | Sadd et al. | |

OTHER PUBLICATIONS

U.S. Appl. No. 14/626,177, Sadd, M. et al., "Memory Device With Combined Non-Volatile Memory (NVM) and Volatile Memory", filed Feb. 19, 2015.

* cited by examiner

*Primary Examiner* — Son Dinh

(57) ABSTRACT

An integrated circuit (IC) device includes a static random access memory (SRAM) array, and a resistive memory (resistive memory) array. A first set of programmable resistive elements in the resistive memory array are used to store data from memory cells in the SRAM array. Sense amplifier circuitry is couplable to the SRAM array and the resistive memory array. An arbiter is configured to assert an resistive memory enable signal to couple the sense amplifier circuitry to the resistive memory array and decouple the sense amplifier circuitry from the SRAM array during a resistive memory read operation, and to couple the sense amplifier to the SRAM array and decouple the sense amplifier circuitry from the resistive memory array during an SRAM read operation.

20 Claims, 4 Drawing Sheets

NONVOLATILE STATIC RANDOM ACCESS MEMORY (NVSRAM) SYSTEM HAVING A STATIC RANDOM ACCESS MEMORY (SRAM) ARRAY AND A RESISTIVE MEMORY ARRAY

BACKGROUND

Field

This disclosure relates generally to memory systems, and more specifically, to memory systems having an SRAM array and a resistive memory array.

Related Art

Resistive memories, such as magnetoresistive RAMs (MRAMs), are commonly used non-volatile memories. However, read and write access times for resistive memories are typically slow, especially as compared to read and write access times for SRAMs. Therefore, in some systems, non-volatile memory (NVM) backup to SRAM is used. In such systems, an SRAM is used for operation on the data, and upon power down, the data is moved from SRAM to a NVM, such as MRAM. The data is then restored back to the SRAM upon powering up. This solution provides the operation efficiency offered by SRAMs and the non-volatility provided by MRAMs. Such a system may be referred to as a non-volatile SRAM (NVSRAM). In one NVSRAM solution, a bus interface between the two memories is required which must switch during data transfer between the two memories. Alternative solutions includes memory cells which have both volatile and non-volatile portions, but these are area inefficient. Therefore, a need exists for improved NVSRAM system which enables store and restore operations and is area efficient.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A NVSRAM system includes a discrete SRAM array and resistive memory array used to store and restore backup data. Data is stored from the SRAM array to the resistive memory array for backup and restored back from the resistive memory array to the SRAM array for normal operation. In order to gain area efficiency, the resistive memory array and SRAM array share the sense amplifiers. For an SRAM read operation, the sense amplifiers are used to provide the output data. In one embodiment, the resistive memory array is an MRAM array. An MRAM read operation includes two phases: a calibration phase and a non-calibration (i.e. sense) phase. For an MRAM read operation, the sense amplifiers are also used for the non-calibration phase to provide the output data. In this manner, a tightly coupled NVSRAM system provides the appropriate store and restore functionality in an area efficient manner.

Figure 1:
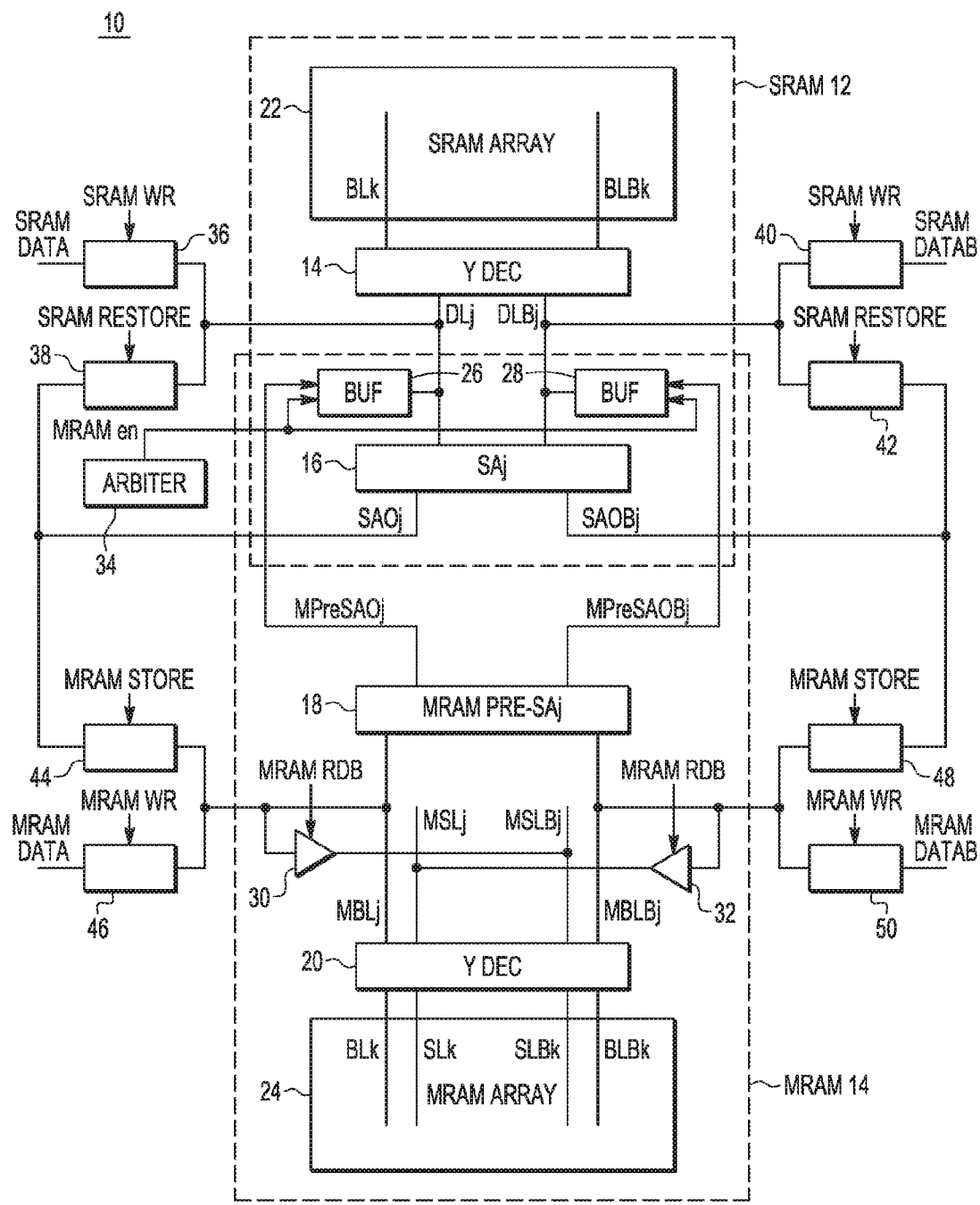
FIG. 1 illustrates, in block diagram form, an NVSRAM system having an SRAM array and a resistive memory array in accordance with one embodiment of the present invention.

FIG. 1 illustrates an NVSRAM system 10 in accordance with one embodiment of the present invention. System 10 includes SRAM 12, resistive memory 13, arbiter 34, and switches 36, 38, 44, 46, 40, 42, 48, and 50. In the example of FIG. 1, it is assumed that resistive memory 13 is an MRAM, and thus the description of FIG. 1 will be in reference to MRAM 13 which includes an MRAM array 24. SRAM 12 includes an SRAM array 22, Y decoders 14, and sense amplifiers 16. SRAM array 22 includes i true bit lines (BLi) and i complementary bit lines (BLBi), in which each bit cell is coupled to a true bit line and a corresponding complementary bit line. The i bit line pairs are provided to Y decoders 14 which produces j true data lines (DLj) and j complementary data lines (DLBj), in which a subset of the i bit line pairs is used to provide the j data line pairs by Y decoders 14 based on the input SRAM access address. The SRAM array and Y decoders can be implemented as known in the art. The data line pairs are provided to j sense amplifiers 16, which includes one sense amplifier per data line pair, and produces j true sense amplifier outputs (SAOj) and j complementary sense amplifier outputs (SAOBj). Further details of sense amplifiers 16 will be provided in reference to FIGS. 2-4 below.

MRAM 13 includes MRAM array 24, Y decoders 20, buffers 30 and 32, MRAM pre-sense amplifier circuitry 18, buffers 26 and 28, and sense amplifiers 16. MRAM array 24 includes k true bit lines (BLk), k true source lines (SLk), k complementary source lines (SLBk), and k complementary bit lines (BLBk). Each bit cell in MRAM array 24 is coupled to a corresponding bit line pair and source line pair. The k bit line pairs and k source line pairs are coupled to Y decoders 20 which produce j true MRAM source lines (MSLj) and j complementary MRAM source lines (MSLBj), in which a subset of the i source line pairs and bit line pairs is used to provide the j MRAM source line pairs by Y decoders 20 based on the input MRAM access address. The MRAM array and Y decoders can be implemented as known in the art. The MRAM source line pairs are provided to j MRAM pre-sense amplifier circuitry 18, which provides j true MRAM pre-sense amplifier outputs (MPreSAOj) and j complementary MRAM pre-sense amplifier outputs (MPreSAOBj) to buffers 26 and 28, respectively. Arbiter 34 provides an MRAM enable signal to each of buffer 26 and 28, which, when asserted, enables buffers 26 and 28 to provide MPreSAOj and MPreSAOBj to sense amplifiers 16. Further details of MRAM pre-sense amplifier circuitry 18 will be provided in reference to FIGS. 2-4 below.

During normal operation of a data processing system including system 10, SRAM 12 and thus SRAM array 22, is used for operation because it performs quicker reads and writes as compared to MRAM 13. Upon power down, data is moved from SRAM array 22 to MRAM array 24, so as to not lose data. For example, data from SRAM array 22 can be moved to a first portion of MRAM array 24. (Note that data other than data from SRAM array 22 can be stored in a second portion of MRAM array 24.) Upon powering back up, the previously moved data is restored from MRAM array 24 back to SRAM array 22. Therefore, included in system 10 are switches 36, 38, 44, 46, 40, 42, 48, and 50 to direct data as needed during normal operation and during store and restore functions.

Switch 36 is coupled to receive SRAM DATA and an SRAM write control signal (SRAM WR), and switch 40 is coupled to receive complementary SRAM DATA (SRAM DATAB) and SRAM WR. SRAM WR indicates when a normal SRAM write is to occur of SRAM DATA into SRAM array 22. When SRAM WR is asserted, SRAM DATA is provided onto DLj, and SRAM DATAB is provided onto DLBj. Switch 38 is coupled to receive SAOj and an SRAM restore control signal (SRAM RESTORE), and switch 42 is coupled to receive SAOBj and SRAM RESTORE. SRAM RESTORE indicates when a write of data from MRAM array 24 is to occur to SRAM array 22 to restore data back from MRAM array 24 to SRAM array 22. When SRAM RESTORE is asserted, SAOj is provided onto DLj, and SAOBj is provided onto DLBj. This may occur when MRAM_en is asserted and therefore buffers 26 and 28 provide MPreSAOj and MPreSAOBj, respectively, to sense amplifiers 16 to produce SAOj and SAOBj. SAOj and SAOBj are then provided, after data has been sensed and latched by sense amplifiers 16, via switches 38 and 42, to DLj and DLBj, respectively.

Switch 46 is coupled to receive MRAM DATA and an MRAM write control signal (MRAM WR), and switch 50 is coupled to receive complementary MRAM DATA (MRAM DATAB) and MRAM WR. Each of buffers 30 and 32 receive a negative logic read bar control signal (RDB) which during a read, is asserted to a logic level 0 and during a write, is negated to a logic level 1. MRAM WR indicates when a normal MRAM write is to occur of MRAM DATA into MRAM array 24. When MRAM WR is asserted, MRAM DATA and MRAM DATAB are provided to MBLj and MBLBj, respectively. During a write, RDB is a logic level 1, thus enabling buffers 30 and 32 to also provide MRAM DATA and MRAM DATAB to MSLBj and MSLj, respectively. In this manner, the values on MBLj and MSLj will be complementary to each other, and the values on MBLBj and MSLBj will be complementary to each other, as is needed for a write to MRAM array 24. Switch 44 is coupled to receive SAOj and MRAM store control signal (MRAM STORE), and switch 48 is coupled to receive SAOBj and MRAM STORE. MRAM STORE indicates when a write of data from SRAM 22 is to occur to MRAM 24. When MRAM STORE is asserted, SAOj and SAOBj are provided to MBLj, MBLBj, MSLj, and MSLBj as appropriate (as directed by the connections to MBLj and MSLBj and the connections of buffers 30 and 32 to MSLBj and MSLj). In this case, MRAM_en may be negated since a read from SRAM array 22 using sense amplifiers 16 is occurring.

Control circuitry (not shown) can be used to provide SRAM access addresses to SRAM array 22 and Y decoders 14 and provide MRAM access addresses to MRAM array 24 and Y decoders 20. The control circuitry can also provide the control signals SRAM WR, SRAM RESTORE, MRAM STORE, MRAM WR, and MRAM_en. The control circuitry can provide these signals as needed to implement the store and restore functions described above.

Arbiter 34, as described above, provides MRAM_en to buffers 26 and 28 and indicates which memory array being used for a read operation. For example, when MRAM_en is asserted, a read from MRAM array 24 is being performed. Y decoders 20 and MRAM pre-sense amplifiers 18 are enabled, coupling MPreSAOj and MPreSAOBj to sense amplifiers 16. Sense amplifiers 16 are decoupled from SRAM array 22 by turning off Y decoders 14 such that all bit line pairs of SRAM array 22 are deselected. When the MRAM_en signal is negated, a read from SRAM array 22 is being performed. Y decoders 14 are enabled, and the j data line pairs couple SRAM array 22 to sense amplifiers 16. Sense amplifiers 16 are decoupled from MRAM array 24 and MRAM pre-sense amplifier circuitry 18 by disabling buffers 26 and 28.

Figure 2:
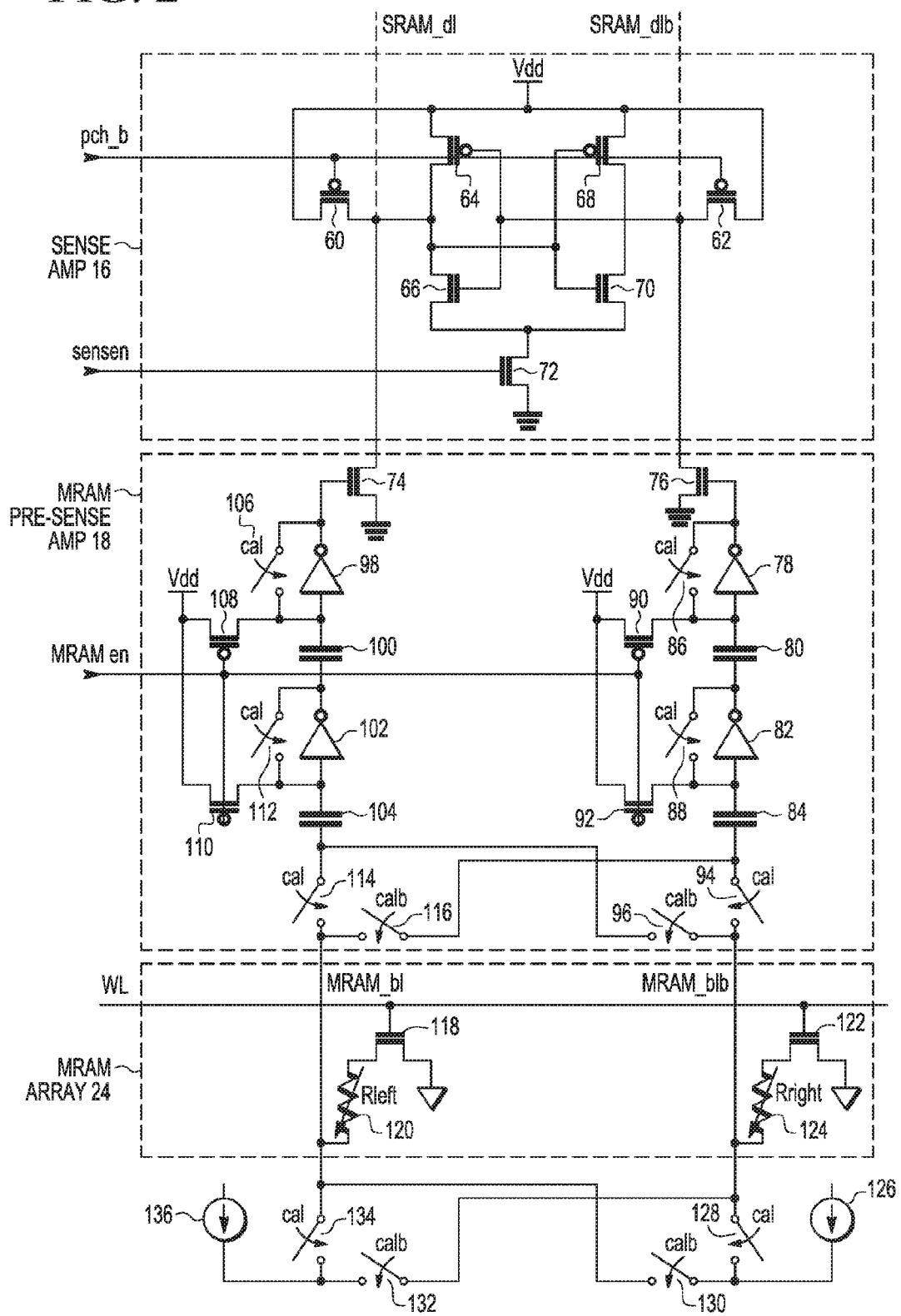
FIG. 2 illustrates, in schematic form a portion of the sense amplifier, the resistive memory pre-sense amplifier, and the resistive memory array of the NVRAM system of FIG. 1, in accordance with one embodiment of the present invention.

FIG. 2 illustrates, in schematic form, a portion of sense amplifiers 16, a portion of MRAM pre-sense amplifier circuitry 18, and a portion of MRAM array 24 in further detail in accordance with one embodiment of the present invention. The illustrated portion of sense amplifiers 16 includes p-type transistors 60, 62, 64, and 68, and n-type transistors 66, 70, and 72. The illustrated portion of MRAM pre-sense amplifier circuitry 18 includes n-type transistors 74 and 76, p-type transistors 108, 110, 90, and 92, inverting amplifiers 98, 102, 78, and 82, capacitors 100, 104, 80, and 84, and switches 106, 112, 86, 88, 114, 116, 96, and 94. The inverting amplifiers 98, 102, 78, and 82 may be implemented as logic inverters, but more generally, may be any circuit that provides negative voltage gain. The illustrated portion of MRAM array 24 includes n-type transistors 118 and 122, and programmable resistive elements 120 and 124. Also included in FIG. 2 are switches 134, 132, 128, and 130, and current sources 136 and 126.

Referring to sense amplifier 16, a first current electrode of each of transistors 60, 74, 68, and 62 is coupled to a first voltage supply terminal, e.g., Vdd. A second current electrode of transistors 60 is coupled to a second current electrode of transistor 74. A second current electrode of transistors 62 is coupled to a control electrode of transistor 74. A first current electrode of transistor 66 is coupled to the second current electrode of transistor 74, control electrode of transistors 66 is coupled to the control electrode of transistor 74, and a second current electrode of transistor 66 is coupled to a first current electrode of transistor 72. A first current electrode of transistor 70 is coupled to a second current electrode of transistor 68, a control electrode of transistor 70 is coupled to a control electrode of transistor 68 and the second current electrode of transistor 74, and a second current electrode of transistor 70 is coupled to the first current electrode of transistor 72. A second current electrode of transistor 72 is coupled to a second voltage supply terminal (e.g. ground). Control electrodes of transistors 60 and 62 are coupled to receive a precharge signal, pch_b, and a control electrode of transistor 72 is coupled to receive a sense enable signal, sensen.

Referring to MRAM pre-sense amplifier 18, a first current electrode of transistor 74 is coupled to a second current electrode of transistor 60, a second current electrode of transistor 74 is coupled to the second voltage supply terminal. A control electrode of transistor 74 is coupled to the output of inverting amplifier 98 and a first terminal of switch 106. An input of inverting amplifier 98 is coupled to a second terminal of switch 106, a first current electrode of transistor 108, and a first terminal of capacitor 100. A second terminal of capacitor 100 is coupled to an output of inverting amplifier 102 and a first terminal of switch 112. An input of inverting amplifier 102 is coupled to a second terminal of switch 112, a first current electrode of transistor 110, and a first terminal of capacitor 104. A second terminal of capacitor 104 is coupled to a first terminal of switch 114 and a first terminal of switch 96. Second current electrodes of transistors 108 and 110 are coupled to the first supply voltage terminal. Control electrodes of transistors 108 and 110 are coupled to receive MRAM_en.

Still referring to MRAM pre-sense amplifier 18, a first current electrode of transistor 76 is coupled to a second current electrode of transistor 62, a second current electrode of transistor 76 is coupled to the second voltage supply terminal. A control electrode of transistor 76 is coupled to the output of inverting amplifier 78 and a first terminal of switch 86. An input of inverting amplifier 78 is coupled to a second terminal of switch 86, a first current electrode of transistor 90, and a first terminal of capacitor 80. A second terminal of capacitor 80 is coupled to an output of inverting amplifier 82 and a first terminal of switch 88. An input of inverting amplifier 82 is coupled to a second terminal of switch 88, a first current electrode of transistor 92, and a first terminal of capacitor 84. A second terminal of capacitor 84 is coupled to a first terminal of switch 116 and a first terminal of switch 94. Second current electrodes of transistors 90 and 92 are coupled to the first supply voltage terminal. Control electrodes of transistors 90 and 92 are coupled to receive MRAM_en. A second terminal of switch 114 is coupled to a second terminal of switch 116, and a second terminal of switch 94 is coupled to a second terminal of switch 96. Note capacitors 80 and 84, inverting amplifiers 78 and 82, and switches 86 and 88 may collectively be referred to as a capacitive circuit which includes switched capacitors. Similarly, capacitors 100 and 104, inverting amplifiers 98 and 102, and switches 106 and 112 may collectively be referred to as a capacitive circuit which includes switched capacitors. Furthermore, the capacitive circuits may include additional elements such as more capacitors or different elements, such as different elements to implement an inverting amplifier.

Referring to MRAM array 24, a word line (WL) is coupled to control electrodes of transistors 118 and 122. A first terminal of programmable resistive element 120 is coupled to an MRAM bit line, MRAM_bl, which is coupled to a second terminal of switch 114. A second terminal of resistive element 120 is coupled to a first current electrode of transistor 118 and a second current electrode of transistors 118 is coupled to the second voltage supply terminal. A first terminal of programmable resistive element 124 is coupled to an MRAM complementary bit line, MRAM_blb, corresponding to MRAM_bl, which is coupled to a second terminal of switch 94. A second terminal of resistive element 124 is coupled to a first current electrode of transistor 122, and a second current electrode of transistor 122 is coupled to the second voltage supply terminal. Each programmable resistive element in MRAM array 24, such as programmable resistive element 120 and 124, can be programmed to a high resistive state (HRS) or a low resistive state (LRS). In one example, HRS corresponds to a logic level 0 and LRS to a logic level 1. When programmed, resistive elements 120 and 124 are programmed to opposite states. For example, if resistive element 120 is programmed to an HRS, then resistive element 124 is programmed to an LRS. Resistive elements 120 and 124 are used together to provide the logic value (1 or 0) of a bit cell. In one embodiment, the programmable resistive elements are Magnetoresistive Tunnel Junction (MTJ) devices.

Still referring to FIG. 2, a first terminal of switch 134 is coupled to MRAM_bl and a first terminal of switch 130. A first terminal of switch 128 is coupled to MRAM_blb and a first terminal of switch 132. An output of current source 136 is coupled to second terminals of switches 134 and 132. An output of current source 126 is coupled to second terminals of switches 128 and 130. A control input of each of switches 106, 112, 114, 86, 88, 94, 134, and 128 is coupled to receive a calibration signal, cal. A control input of each of switches 116, 96, 132, and 130 is coupled to receive the complement of the calibration signal, calb.

Note that in FIG. 2, only one data line and complementary data line with its corresponding sense amplifier as well as only one MRAM bit line and complementary bit line with its corresponding MRAM pre-sense amplifier is illustrated. However, as illustrated in FIG. 1, SRAM 12 includes j data line pairs (DLj and DLBj), and MRAM 14 includes j MRAM bit line pairs (MBLj and MBLBj) and j MRAM source line pairs (MSLj and MSLBj). System 10 would include the circuitry of FIG. 2 for each of the j pairs. However, the description of operation will be provided with reference to the one SRAM data line pair (SRAM_dl and SRAM_dlb) and MRAM bit line pair (MRAM_bl and MRAM_blb), with the source line corresponding to the second current electrodes of transistors 118 and 112 coupled to the second voltage supply terminal.

In operation, during an SRAM read of SRAM array 22, MRAM_en is negated (to a logic level 0), which places Vdd at the input of inverting amplifiers 98, 102, 82, and 78. Also, cal is negated such that switches 106, 112, 86, and 88 are open. This therefore turns off transistors 74 and 76. This allows sense amplifiers 16 to sense the logic state on the bit cell of SRAM array 22 coupled to SRAM_dl and SRAM-_dlb. The precharge and sense enable signals can be controlled, as needed, to perform the read operation. For example, pch_b can be asserted during a first portion of the SRAM read operation (to a logic level 0) and sensen negated (to a logic level 0), which results in coupling both SRAM_dl and SRAM_dlb to the same voltage, Vdd. Once the precharge is complete, during a second portion of the SRAM read operation, pch_b is negated and afterwards, sensen is asserted (to a logic level 1) which turns on transistor 72. The timing of these two signals can be controlled by additional circuitry (not shown) as needed for proper operation. For example, it should be ensured that the precharging is complete before commencing the sensing. During this second portion of the SRAM read operation, the currents pulled down on SRAM_dl and SRAM_dlb by the selected SRAM bit cell are sensed to determine the value of the bit cell, and SAO and SAOb can be output accordingly. For example, SRAM_dl and SRAM_dlb can be provided to buffers to provide SAO and SAOb, respectively, in which these buffers are enabled once values are sensed. Since transistors 74 and 76 are off, MRAM array 24 and MRAM pre-sense amplifiers 18 are decoupled from sense amplifiers 16.

In operation, during an MRAM read of MRAM array 24, MRAM_en is asserted (to a logic level 1), thus enabling MRAM pre-sense amplifiers 18. During an MRAM read operation, MRAM pre-sense amplifiers 18 provides pull-down transistors 74 and 76 the necessary signals that result in SRAM_dl and SRAM_dlb being what an SRAM bit cell would provide if SRAM array 22 were coupled to sense amplifiers 16 and providing the read data instead. That is, during the MRAM read operation, to sense amplifiers 16, the SRAM bit lines appear as if they were coming from SRAM array 22 rather than MRAM array 24. Note that transistors 74 and 76 correspond to a part of buffers 26 and 28 of FIG. 1. With MRAM_en asserted, transistors 108, 110, 88, and 92 are turned off, decoupling VDD from the inputs of inverting amplifiers 98, 102, 78, and 82 and allowing them to operate according to the values provided at their inputs by the normal circuit operation.

Figure 3:
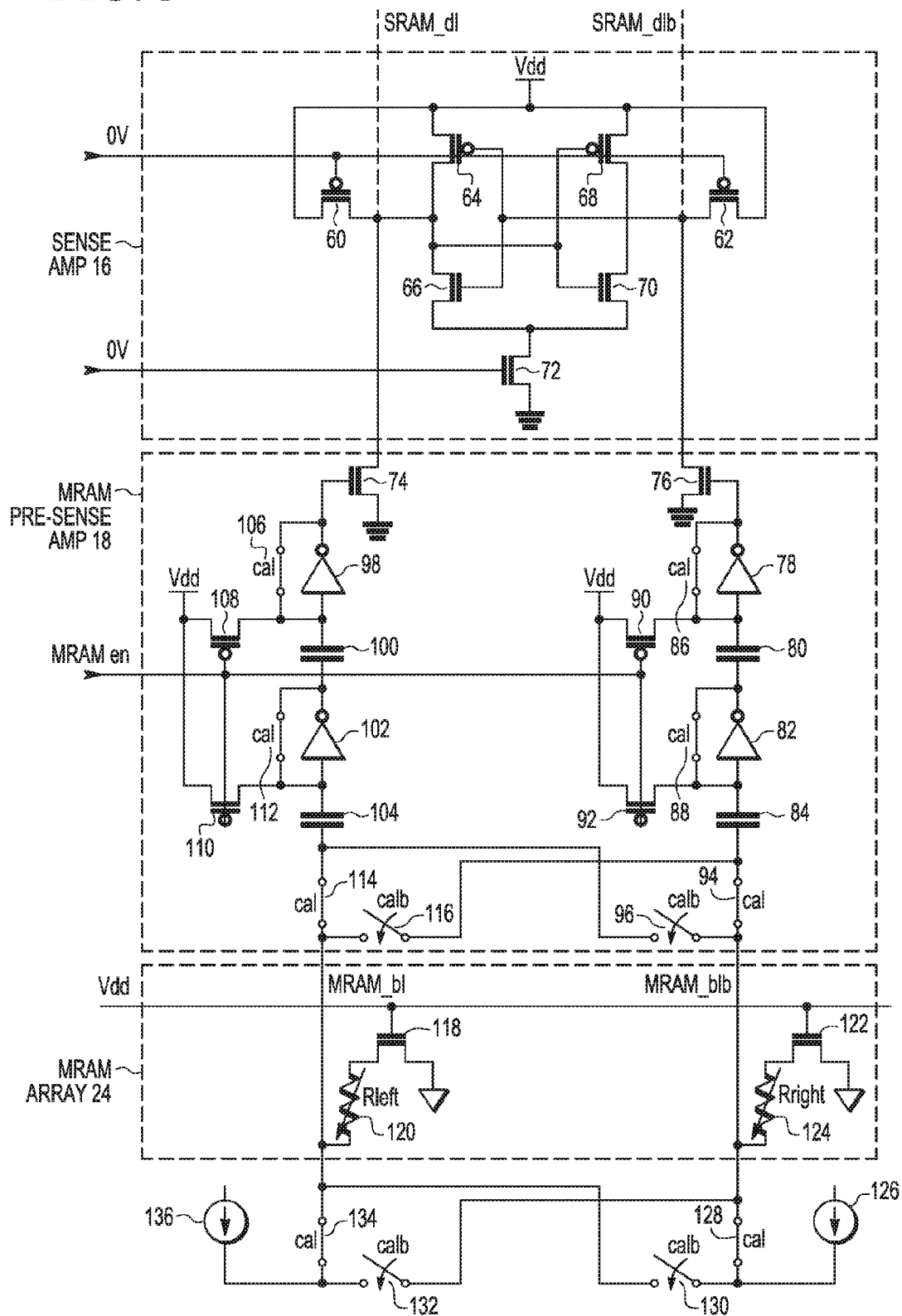
FIGS. 3 and 4 illustrate, in schematic form, the portion of FIG. 2 during the calibration phase and non-calibration phase, respectively, in accordance with one embodiment of the present invention.
Figure 4:
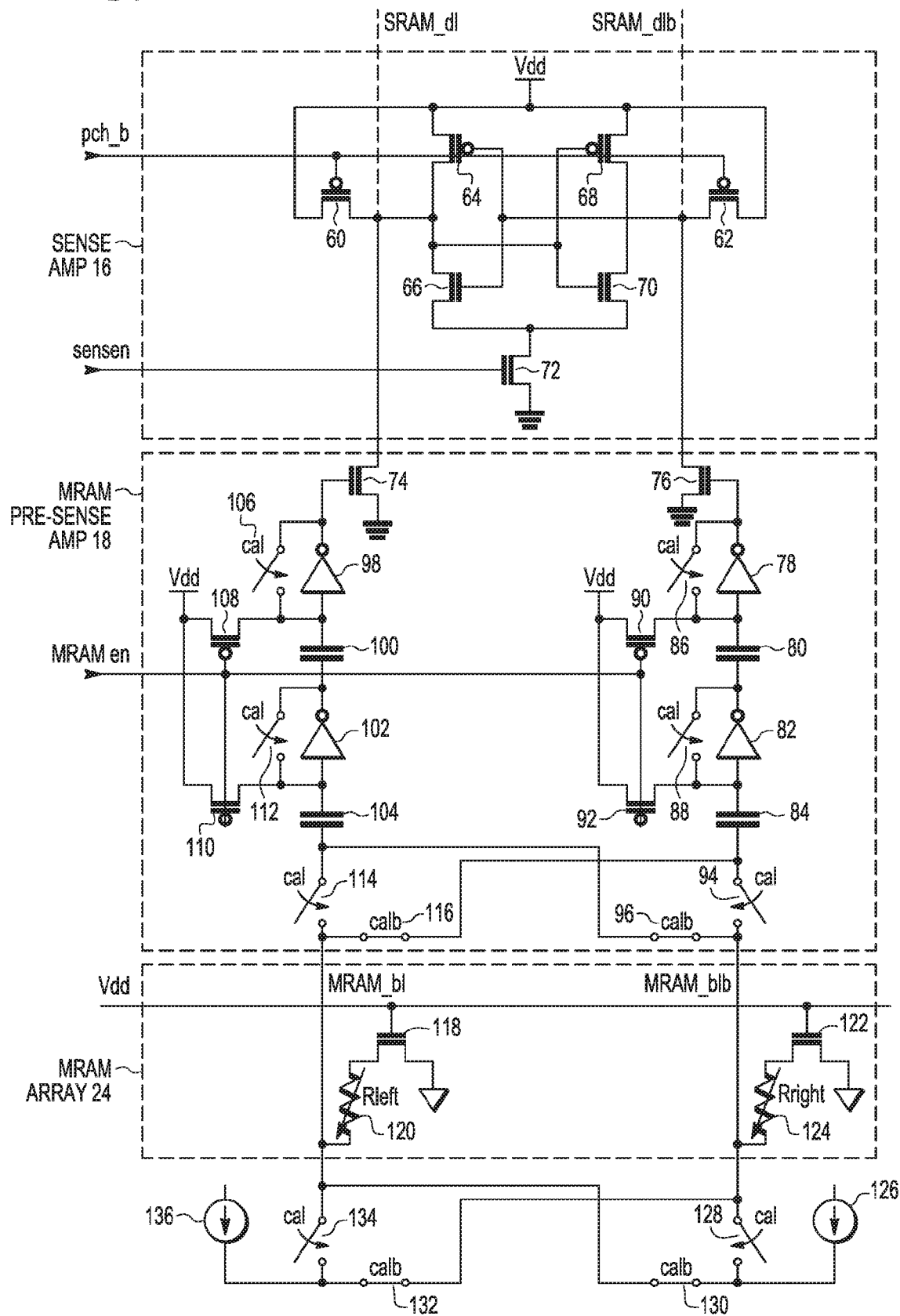

The MRAM read operation includes two phases: the calibration phase and the non-calibration (i.e. the sense) phase. These phases may also be referred to as modes. For the calibration phase, cal is asserted (e.g. to a logic level 1) and therefore calb is negated (to a logic level 0), and for the non-calibration phase, cal is negated (to a logic level 0) and calb is asserted (to a logic level 1). FIGS. 3 and 4 illustrate the same circuit as FIG. 2, but the switches are configured for the calibration phase in FIG. 3 and for the non-calibration phase in FIG. 4. In FIGS. 3 and 4, when the control input of a switch is asserted (e.g. a logic level 1), the switch is closed or in its conductive state, and when the control input is negated (e.g. a logic level 0), the switch is open or in its non-conductive state.

Referring to the calibration phase and FIG. 3, due to cal being asserted and calb negated, switches 106, 112, 86, 88, 114, 94, 134, and 128 are closed, and switches 116, 96, 132, and 130 are open. Operation of the circuit of FIG. 3 will be described in reference to the right half of MRAM pre-sense amplifier 18, including current source 126. The description of the left half of MRAM pre-sense amplifier 18, including current source 136 is analogous to the right half. During the calibration phase, current from current source 126 is provided via closed switch 128 up through MRAM_blb, which results in an IR drop over programmable resistive element 124. This voltage appears, via closed switch 94, on capacitor 84 and thus charges capacitor 84. With switch 88 closed, inverting amplifier 82 is set at its trip point. Similarly, inverting amplifier 78 provides a second stage of amplification in which capacitor 80 stores the charge at the output of inverting amplifier 82. With switch 86 closed, inverting amplifier 78 is also set at its trip point. Analogous operation occurs with current source 136 and the left side. Therefore, inverting amplifiers 98 and 102 are set at their trip points as well. Note that at this point, a charge is stored on capacitors 84, 80, 104, and 100. Also, during the calibration phase, pch_b is asserted (to a logic level 0) and sensen is negated (to a logic level 0), thus coupling Vdd to both SRAM_dl and SRAM_dlb. This sets both the true data line and complementary data line to the same voltage, Vdd, so as to precharge sense amplifiers 16. As discussed above, the timing of pch_b and sensen can be controlled to ensure that the precharging is complete and a voltage difference is present on SRAM_dl and SRAM_dlb before sensed data is latched.

Referring to FIG. 4, during the non-calibration phase, due to cal being negated and calb asserted, switches 106, 112, 86, 88, 114, 94, 134, and 128 are open, and switches 116, 96, 132, and 130 are closed. In this phase, the current from current source 126 is provided via closed switch 130 up through MRAM_bl, which results in an IR drop over programmable resistive element 120. This voltage appears at capacitor 84 via closed switch 116 and is compared to the charge stored on this capacitor during the calibration phase. With switch 88 open, inverting amplifier 82 is tripped accordingly. For example, since inverting amplifier 82 was previously set to its trip point, if the voltage on capacitor 84 goes down, even a little, from where it was before, then inverting amplifier 82 trips, outputting towards a logic level 1. Therefore, in this example, inverting amplifier 78 outputs a logic level 0, turning off transistor 76. If the voltage on capacitor 84 goes up, even a little, from where it was before, then inverting amplifier 82 trips and outputs towards a logic level 0. In this case, inverting amplifier 78 outputs a logic level 1, turning on pull down transistor 76. Analogous operation occurs with current source 136 and the left side. Current from 136 is provided via close switch 132 up through programmable resistive element 124, and the voltage appears at capacitor 104 via close switch 96. With switch 112 open, inverting amplifier 102 trips accordingly. The output of inverting amplifier 102 is provided to inverting amplifier 98, whose output is provided to turn on or off pull down transistor 74. Also, during the non-calibration phase, sensen is asserted so that sense amplifiers 16 can sense the value on SRAM_dl and SRAM_dlb which result from pull down transistors 74 and 76 controlled by MRAM pre-sense amplifiers 18.

As discussed above, each of programmable resistive element 120 and 124 can either be in an HRS or LRS. Programmable resistive elements 120 and 124 are programmed into opposite states and the combination of both resistive elements store the logic value of a bit cell. The difference between the HRS and LRS, though, is very small, requiring a high sensitivity to detect the difference. By setting capacitors 84 and 104 during the calibration phase, and comparing capacitors 84 and 104 to their previous values during the non-calibration phase, MRAM pre-sense amplifiers 18 can properly set the values at the control gates of transistors 74 and 76 which imitate what the bit lines of SRAM array 22 would be if the same logic value were stored in an SRAM cell.

Current source 136, ideally, provides the same current as current source 126. In one embodiment, current sources 136 and 126 are implemented as current mirrors. Generally, there is mismatch in current sources 136 and 126. By running current first through switches 134 and 114 and switches 128 and 94 during the calibration phase and then through switches 132 and 96 and switches 130 and 116 during the non-calibration phase, the mismatch in current sources is addressed. That is, during the calibration phase, a first current/voltage path is used to charge switch capacitors (e.g. capacitors 104 and 84) corresponding to the voltage drop across the respective programmable resistive element. During the non-calibration phase, a second current/voltage path is used to sense the change in voltage drop for the complementary programmable resistive element. This swapping of the current/voltage paths ensures that the circuitry remains accurate even with process variations in the current sources and programmable resistive elements.

By now it can be understood how shared sense amplifiers can be used to provide output data from an SRAM array for an SRAM read operation and to provide output data from an MRAM array during the calibration phase of an MRAM read operation. Thus, an NVSRAM system can provide the operation efficiency offered by SRAMs and the non-volatility provided by MRAMs in an area efficient manner. Furthermore, by providing two different current/voltage paths during the MRAM read operation, improved MRAM operation can be achieved despite process variations.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by an asterisk (*) or "_b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, different designs of an SRAM array or different resistive memory arrays may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit (IC) device includes: a static random access memory (SRAM) array; a resistive memory resistive memory array, wherein a first set of programmable resistive elements in the resistive memory array are used to store data from memory cells in the SRAM array; sense amplifier circuitry couplable to the SRAM array and the resistive memory array; an arbiter configured to assert an resistive memory enable signal to couple the sense amplifier circuitry to the resistive memory array and decouple the sense amplifier circuitry from the SRAM array during a resistive memory read operation, and couple the sense amplifier to the SRAM array and decouple the sense amplifier circuitry from the resistive memory array during an SRAM read operation. In one aspect, the IC device further includes resistive memory pre-sense amplifier circuitry couplable between the resistive memory array and the sense amplifier circuitry, wherein the resistive memory pre-sense amplifier circuitry is coupled to the sense amplifier circuitry during the resistive memory read operation and decoupled from the sense amplifier circuitry during the SRAM read operation. In another aspect, a second set of the programmable resistive elements in the resistive memory array are used to store data other than data from the SRAM array. In another aspect, two of the programmable resistive elements of the resistive memory array are programmed in opposite states to store a logical bit of data from the SRAM array. In a further aspect, the pre-sense amplifier includes a first capacitive circuit and a second capacitive circuit; calibration switches operable to: couple a first of the two programmable resistive elements to the first capacitive circuit and a second of the two programmable resistive elements to the second capacitive circuit during a calibration mode, and couple the first of the two programmable resistive elements to the second capacitive circuit and the second of the two programmable resistive elements to the first capacitive circuit during a sense mode of the resistive memory read operation. In a further aspect, the IC device further includes a first current source and a second current source; additional calibrations switches operable to: during the calibration mode: couple the first current source to the first of the two programmable resistive elements and the first capacitive circuit; couple the second current source to the second of the two programmable resistive elements and the second capacitive circuit, and during the sense mode: couple the first current source to the second of the two programmable resistive elements and the first capacitive circuit; couple the second current source to the first of the two programmable resistive elements and the second capacitive circuit. In another further aspect, the IC device further includes a word line; a true bit line; a complementary bit line; a first of the two programmable resistive elements is coupled to the true bit line and the word line; and a second of the two programmable resistive elements is coupled the complementary bit line and the word line. In another further aspect, the pre-sense amplifier circuit further includes a first buffer coupled to an output of the first capacitive circuit; a second buffer coupled to an output of the second capacitive circuit. In yet a further aspect, the first and second buffers are respective first and second pull-down transistors, a gate electrode of the first pull-down transistor is coupled to the output of the first capacitive circuit, and a gate electrode of the second pull-down transistor is coupled to the output of the second capacitive circuit. In another yet further aspect, the IC device further includes a true data line and a complementary data line are coupled to a column decoder for the memory cells in the SRAM array, to the sense amplifier, and to respective ones of the first and second buffers. In yet an even further aspect, the first and second capacitive circuits include switched capacitors.

In another embodiment, a method of operating a static random access memory (SRAM) array and a resistive memory array includes during a read operation of the resistive memory array: selecting programmable resistive elements of the resistive memory array; coupling the selected programmable resistive elements of the resistive memory array to a pre-sense amplifier circuit; decoupling the SRAM array from a sense amplifier circuit, and sensing data from differential pairs of the selected programmable resistive elements in data buffers of the pre-sense amplifier circuit, wherein the data buffers are coupled to respective true data lines and complementary data lines of the sense amplifier circuit; during a read operation of the SRAM array, decoupling the resistive memory array from the sense amplifier circuit, and sensing data on true and complementary bit lines of the SRAM array with the sense amplifier circuit. In one aspect, the method further includes coupling a first of the selected programmable resistive elements to a first capacitive circuit and a second of the selected programmable resistive elements to a second capacitive circuit during a calibration phase of the read operation of the resistive memory array, and coupling the first of the selected programmable resistive elements to the second capacitive circuit and the second of the selected programmable resistive elements to the first capacitive circuit after the calibration phase of the read operation of the resistive memory array. In a further aspect, the method further includes during the calibration phase of the read operation of the resistive memory array: coupling a first current source to the first of the selected programmable resistive elements and the first capacitive circuit; coupling a second current source to the second of the selected programmable resistive elements and the second capacitive circuit, and after the calibration phase of the read operation of the resistive memory array: coupling the first current source to the second of the selected programmable resistive elements and the first capacitive circuit; coupling the second current source to the first of the selected programmable resistive elements and the second capacitive circuit. In another aspect, the method further includes storing data from the SRAM array in a first portion of the resistive memory array; and storing data other than data from the SRAM array in a second portion of the resistive memory array. In yet another further aspect, the method further includes selecting a first of the programmable resistive elements using a true bit line and a word line; and selecting a second of the differential pair of programmable resistive elements using a complementary bit line and the word line. In a further aspect, the method further includes programming the selected first and second of the programmable resistive elements of the resistive memory array in opposite states to store a logical bit of data from the SRAM array. In yet another aspect, the pre-sense amplifier circuit further includes: during the read operation of the resistive memory array, decoupling the SRAM array from the sense amplifier circuit through a column decoder or an arbiter; during the read operation of the SRAM array, coupling the SRAM array to the sense amplifier circuit through the column decoder or the arbiter.

In yet another embodiment, an integrated circuit includes a static random access memory (SRAM) array; a resistive memory array; a pre-sense amplifier circuit; a sense amplifier circuit; wherein during a read operation of the resistive memory array, the SRAM array is decoupled from the sense amplifier circuit; selected programmable resistive elements of the resistive memory array are coupled to the pre-sense amplifier circuit, data from differential pairs of the selected programmable resistive elements is stored in data buffers of the pre-sense amplifier circuit, and data in the data buffers of the pre-sense amplifier circuit is sensed with the sense amplifier circuit; wherein during a read operation of the SRAM array, the resistive memory array is decoupled from the sense amplifier circuit, and data on true and complementary bit lines of the SRAM array is sensed with the sense amplifier circuit. In one aspect, the integrated circuit further includes during a calibration phase of the read operation of the resistive memory array a first of the selected programmable resistive elements is coupled to a first capacitive circuit and a second of the selected programmable resistive elements to a second capacitive circuit, and after the calibration phase of the read operation of the resistive memory array, the first of the selected programmable resistive elements is coupled to the second capacitive circuit and the second of the selected programmable resistive elements is coupled to the first capacitive circuit.

What is claimed is:

1. An integrated circuit (IC) device comprising:
a static random access memory (SRAM) array;
a resistive memory resistive memory array, wherein a first set of programmable resistive elements in the resistive memory array are used to store data from memory cells in the SRAM array;
sense amplifier circuitry couplable to the SRAM array and the resistive memory array;
an arbiter configured to assert an resistive memory enable signal to
couple the sense amplifier circuitry to the resistive memory array and decouple the sense amplifier circuitry from the SRAM array during a resistive memory read operation, and
couple the sense amplifier to the SRAM array and decouple the sense amplifier circuitry from the resistive memory array during an SRAM read operation.

2. The IC device of claim 1 further comprising:
resistive memory pre-sense amplifier circuitry couplable between the resistive memory array and the sense amplifier circuitry, wherein the resistive memory pre-sense amplifier circuitry is coupled to the sense amplifier circuitry during the resistive memory read operation and decoupled from the sense amplifier circuitry during the SRAM read operation.

3. The IC device of claim 1 wherein:
a second set of the programmable resistive elements in the resistive memory array are used to store data other than data from the SRAM array.

4. The IC device of claim 1 wherein:
two of the programmable resistive elements of the resistive memory array are programmed in opposite states to store a logical bit of data from the SRAM array.

5. The IC device of claim 4 wherein the pre-sense amplifier comprises:
a first capacitive circuit and a second capacitive circuit;
calibration switches operable to:
couple a first of the two programmable resistive elements to the first capacitive circuit and a second of the two programmable resistive elements to the second capacitive circuit during a calibration mode, and
couple the first of the two programmable resistive elements to the second capacitive circuit and the second of the two programmable resistive elements to the first capacitive circuit during a sense mode of the resistive memory read operation.

6. The IC device of claim 5 further comprising:
a first current source and a second current source;
additional calibrations switches operable to:
during the calibration mode:
couple the first current source to the first of the two programmable resistive elements and the first capacitive circuit;
couple the second current source to the second of the two programmable resistive elements and the second capacitive circuit, and
during the sense mode:
couple the first current source to the second of the two programmable resistive elements and the first capacitive circuit;
couple the second current source to the first of the two programmable resistive elements and the second capacitive circuit.

7. The IC device of claim 4 further comprising:
a word line;
a true bit line;
a complementary bit line;

a first of the two programmable resistive elements is coupled to the true bit line and the word line; and
a second of the two programmable resistive elements is coupled the complementary bit line and the word line.

8. The IC device of claim 5 wherein the pre-sense amplifier circuit further includes:
a first buffer coupled to an output of the first capacitive circuit;
a second buffer coupled to an output of the second capacitive circuit.

9. The IC device of claim 8 wherein:
the first and second buffers are respective first and second pull-down transistors,
a gate electrode of the first pull-down transistor is coupled to the output of the first capacitive circuit, and
a gate electrode of the second pull-down transistor is coupled to the output of the second capacitive circuit.

10. The IC device of claim 8, further comprising:
a true data line and a complementary data line are coupled to a column decoder for the memory cells in the SRAM array, to the sense amplifier, and to respective ones of the first and second buffers.

11. The device of claim 10 wherein the first and second capacitive circuits include switched capacitors.

12. A method of operating a static random access memory (SRAM) array and a resistive memory array, comprising:
during a read operation of the resistive memory array:
selecting programmable resistive elements of the resistive memory array;
coupling the selected programmable resistive elements of the resistive memory array to a pre-sense amplifier circuit;
decoupling the SRAM array from a sense amplifier circuit, and
sensing data from differential pairs of the selected programmable resistive elements in data buffers of the pre-sense amplifier circuit, wherein the data buffers are coupled to respective true data lines and complementary data lines of the sense amplifier circuit;
during a read operation of the SRAM array,
decoupling the resistive memory array from the sense amplifier circuit, and
sensing data on true and complementary bit lines of the SRAM array with the sense amplifier circuit.

13. The method of claim 12 further comprising:
coupling a first of the selected programmable resistive elements to a first capacitive circuit and a second of the selected programmable resistive elements to a second capacitive circuit during a calibration phase of the read operation of the resistive memory array, and
coupling the first of the selected programmable resistive elements to the second capacitive circuit and the second of the selected programmable resistive elements to the first capacitive circuit after the calibration phase of the read operation of the resistive memory array.

14. The method of claim 13 further comprising:
during the calibration phase of the read operation of the resistive memory array:
coupling a first current source to the first of the selected programmable resistive elements and the first capacitive circuit;
coupling a second current source to the second of the selected programmable resistive elements and the second capacitive circuit, and
after the calibration phase of the read operation of the resistive memory array:

coupling the first current source to the second of the selected programmable resistive elements and the first capacitive circuit;
coupling the second current source to the first of the selected programmable resistive elements and the second capacitive circuit.

15. The method of claim 12 further comprising:
storing data from the SRAM array in a first portion of the resistive memory array; and
storing data other than data from the SRAM array in a second portion of the resistive memory array.

16. The method of claim 12 further comprising:
selecting a first of the programmable resistive elements using a true bit line and a word line; and
selecting a second of the differential pair of programmable resistive elements using a complementary bit line and the word line.

17. The method of claim 16 further comprising:
programming the selected first and second of the programmable resistive elements of the resistive memory array in opposite states to store a logical bit of data from the SRAM array.

18. The method of claim 12 wherein the pre-sense amplifier circuit further includes:
during the read operation of the resistive memory array, decoupling the SRAM array from the sense amplifier circuit through a column decoder or an arbiter;
during the read operation of the SRAM array, coupling the SRAM array to the sense amplifier circuit through the column decoder or the arbiter.

19. An integrated circuit comprising:
a static random access memory (SRAM) array;
a resistive memory array;
a pre-sense amplifier circuit;
a sense amplifier circuit;
wherein during a read operation of the resistive memory array,
the SRAM array is decoupled from the sense amplifier circuit;
selected programmable resistive elements of the resistive memory array are coupled to the pre-sense amplifier circuit,
data from differential pairs of the selected programmable resistive elements is stored in data buffers of the pre-sense amplifier circuit, and
data in the data buffers of the pre-sense amplifier circuit is sensed with the sense amplifier circuit;
wherein during a read operation of the SRAM array,
the resistive memory array is decoupled from the sense amplifier circuit, and
data on true and complementary bit lines of the SRAM array is sensed with the sense amplifier circuit.

20. The integrated circuit of claim 19 further comprising:
during a calibration phase of the read operation of the resistive memory array
a first of the selected programmable resistive elements is coupled to a first capacitive circuit and a second of the selected programmable resistive elements to a second capacitive circuit, and
after the calibration phase of the read operation of the resistive memory array, the first of the selected programmable resistive elements is coupled to the second capacitive circuit and the second of the selected programmable resistive elements is coupled to the first capacitive circuit.

* * * * *